United States Patent [19]

Knüttel et al.

[11] Patent Number: 4,674,837
    [45] Date of Patent: Jun. 23, 1987

[54] APPARATUS FOR PRODUCING COMPLETE THREE-DIMENSIONAL IMAGES OF A SPATIAL OBJECT

[75] Inventors: Alexander Knüttel; Bertold Knüttel, both of Rheinstetten, Fed. Rep. of Germany

[73] Assignee: Bruker Medizintechnik GmbH, Fed. Rep. of Germany

[21] Appl. No.: 686,261

[22] PCT Filed: Apr. 12, 1984

[86] PCT No.: PCT/DE84/00089
    § 371 Date: Dec. 4, 1984
    § 102(e) Date: Dec. 4, 1984

[87] PCT Pub. No.: WO84/04193
    PCT Pub. Date: Oct. 25, 1984

[30] Foreign Application Priority Data
    Apr. 13, 1983 [DE]  Fed. Rep. of Germany ....... 3313217

[51] Int. Cl.⁴ ............................................. G02B 27/22
    [52] U.S. Cl. .................................................. 350/130
    [58] Field of Search ............... 350/144, 137, 130, 508, 350/503, 576, 637

[56] References Cited
    U.S. PATENT DOCUMENTS

| | | | |
    |---|---|---|---|
    | 2,258,903 | 10/1941 | Mitchell | 350/144 |
    | 2,544,624 | 3/1951 | Whittaker | 350/130 |
    | 4,130,832 | 12/1978 | Sher | 350/144 |

FOREIGN PATENT DOCUMENTS

| | | |
    |---|---|---|
    | 2830115 | 1/1979 | Fed. Rep. of Germany . |
    | 506097 | 8/1920 | France . |

*Primary Examiner*—John K. Corbin
    *Assistant Examiner*—Vincent J. Lemmo

[57] ABSTRACT

An apparatus produces complete stereoscopic images of a three-dimensional object. It comprises an image transmitter (13) on which are shown one after the other in time two-dimensional images (14) corresponding to sections lying one behind the other in space. In addition, the element (18) is provided which is disposed between the image transmitter (13) and an observer (36), said element being synchronously controlled by the image transmitter (13) and changing the spatial positioning of the image (14) between image transmitter (13) and observer (36). Optical means (31, 32) serve to reduce an image (14) shown on the image transmitter (13) in the plane of the element (18) and to re-enlarge it for analysis. The apparatus is particularly suitable for showing tomographic pictures, i.e. for imaging the inside of a living body.

9 Claims, 2 Drawing Figures

APPARATUS FOR PRODUCING COMPLETE THREE-DIMENSIONAL IMAGES OF A SPATIAL OBJECT

The invention relates to an apparatus for producing complete three-dimensional images of a spatial object, with an image transmitter on which are shown one after the other in time two-dimensional images corresponding to sections lying one behind the other in space, and with an optical element disposed between the image transmitter and an observer, said element being synchronously controlled by the image transmitter and changing the spatial positioning of the image between image transmitter and observer.

Numerous methods and apparatuses are already known which permit stereoscopic imaging. In a first known kind, a two-dimensional image is provided with a shadow pointing in a certain direction so that there is a three-dimensional impression. However, this method merely makes use of an optical illusion and does not increase the information content of what is shown.

Another known method employs a binocular imaging technique, for example with two cameras disposed eye distance apart. With this method, the three-dimensional impression gained by the observer can be produced by the fact that the two imaging channels work in different colours and the observer wears spectacles, of which one glass is tinted in one colour and the other glass in the other colour. Similar techniques have also become known using polarized light and suitably polarized spectacles. Although this kind of three-dimensional imaging exhibits a higher information content, it does not go beyond the sum of the information content of two two-dimensional images received from the two imaging elements. The observer is offered merely a three-dimensional impression corresponding to that gained by an observer who is fixed in relation to an actual three-dimensional object.

Furthermore, apparatuses and methods are known for producing three-dimensional images based on the principle of holography. In this connection, a three-dimensional object is illuminated by a viewing beam, usually a laser beam, and the light reflected by the object is mixed with a reference beam. The resulting interference pattern is stored in the holographic recording so that with suitable lighting of the developed holographic recording there results a three-dimensional impression. With this kind of imaging, the three-dimensional impression is more complete than with the last-mentioned method because, due to the holographic recording technique, the observer is able to go "round the object" since the surface of the imaged object appears to hover freely in space.

Finally, U.S. Pat. No. 4,130,832 discloses another device for achieving apparently three-dimensional images in which pictures are shown consecutively on a screen and the screen is viewed by the observer through a curved mirror whose curvature is depth-modulated synchronously with the timed succession of images on the screen. Through the mirror the observer sees a succession of different images with successive positioning of the mirror so that he gains a three-dimensional impression.

However, the known arrangement has the disadvantage that a relatively large deflectable mirror is used which has the form of a variable-curvature concave mirror which is clamped at the edge and is disposed in a loudspeaker housing in place of a loudspeaker diaphragm and is deflected by the excitation coil of the loudspeaker. This arrangement is mechanically very elaborate and thus also susceptible to trouble. For example, to obtain the deflection frequency of approx. 25 Hz necessary for flicker-free image formation, a mechanical resonator is provided without which such rapid deflection of the large mirror would not be possible at all. Furthermore, changing the curvature of the mirror results in constant modulation of the image size which has to be compensated for by an elaborate computer program. Finally, due to the mechanical resonator used, there is a sinusoidal deflection of the mirror over time with the result that the rate of change of spatial deflection is minimal in the extreme positions and is maximal at the zero crossing. Due to this non-linearity the frame rate on the screen must also be adapted so that the successive frames are shown in particularly rapid sequence during the zero crossing of the concave mirror and correspondingly slower in the extreme positions. This increasing of the imaging frequency leads, however, to considerable data processing problems, particularly in view of the aforementioned need to compensate for imaging errors, so that, on the whole, it is possible only to show just a few image points since the required fast frame frequency including the required image compensation in the case of high-resolution images, i.e. images with many image points, is not possible with available data processing systems.

Conversely, the object of the invention is to further develop an apparatus of the initially mentioned kind so that there is no need to compensate the screen image with regard to two-dimensional imaging and its time sequence.

This object is achieved by the invention in that optical means are provided for reducing the image shown on the image transmitter in the plane of the element and for re-enlarging for analysis.

The mechanically moved elements used in the invention, namely either a plane mirror or an arrangement with optical wedges, can therefore be of very small design due to the initial reduction of the image, with the result that only small masses have to be moved. This allows a strictly linear deflection of the mechanically moved elements with respect to time so that there is no need to correct the image formation over time.

In a particularly preferred embodiment of the invention the apparatus is used in conjunction with a tomograph. This is a device for examining bodies in which consecutive images of plane sections through the body are produced. X-ray computer tomography and nuclear-spin tomography are particularly well-known in the medical field. Images are produced of sections of a patient or part of the body of a patient. These images are of spatially consecutive sections and provide complete information in two, i.e. in a total of three, spatial coordinates on the organ under examination. The images corresponding to the spatially consecutive sections are stored in a computer and can be shown consecutively in rapid time sequence on a screen.

If an element is provided in the path between the observer and the screen, said element changing the spatial positioning between screen and observer in synchronization with the successive images, the result is a complete three-dimensional representation for the observer within the meaning of the initially made remarks on DE-OS No. 28 30 115. Compared to holographic imaging, this technique has the further advantage that not only the surface of the object under consideration is shown, but also the entire spatial area, with the result that in the case of tomograms it is possible to provide a complete three-dimensional image of the inside of a living human body. In this connection—of course, within a certain angle within the limits of the optical elements used—the observer is able to see "round the object"; in particular, he can also recognize further organs lying behind organs lying in front.

By using data processing systems having a suitably high rate of data processing, it will even be possible in future to make measurements on-line, i.e. it may be possible to have a complete three-dimensional view of the inside of a living human body and of the movement of the organs, particularly the respiratory organs and the circulatory organs.

In a particularly preferred embodiment of the invention, the optical means comprise at least two converging elements which are spaced apart by a distance corresponding to the sum of their focal lengths. This arrangement has the particular advantage that, despite the reduction and re-enlargement of the image produced by the image transmitter, there is a guaranteed constant linear magnification of the image seen by the observer, even when the optical element, for example the plane mirror, is deflected. This provides the quite decisive advantage that the image need not be corrected in the plane, as is the case with state-of-the-art variable-curvature concave mirrors. Together with the linear deflection of the mirror or wedge with respect to time, this leads to an exceptional reduction in the outlay on software and hardware for producing the image on the image transmitter. This means that, with a computer system of the same power, it is possible to produce considerably faster sequences of frames or, if keeping the same frame rate, to obtain considerably higher-resolution images with more image points than is the case in the prior art. This advantage is of particular importance with respect to tomographic measurements because the observation of details on such images is frequently of particular importance, for example if incipient tumours are to be detected, or to shorten the total measuring time by first of all producing a rough 3 D overall view and only then making a 2 D shot of high resolution.

Preferably, the optical means are either lenses or spherical mirrors.

In an embodiment of the invention, the same optical means are used for reducing and re-enlarging while in another embodiment of the invention different means are used for reducing and re-enlarging. Whereas the first variant allows a particularly compact construction, the second variant opens up the possibility of additional corrections to optical errors.

In order to vary the spatial positioning between image transmitter and observer, one embodiment of the invention employs a plane mirror which is deflected perpendicularly to its surface. To the relevant extent, this plane mirror is completely free of imaging errors with the result that this also does not require any correction to the image which is to be produced.

When using this plane mirror, the image produced by the image transmitter is preferably shown on the plane mirror through the intermediary of a concave mirror and a biconvex lens. For re-enlargement, the image is returned by the same route and can then be viewed in enlarged form as compared to the image before the plane mirror. Consequently, this construction requires only a few optical elements and is therefore particularly simple and compact.

In a further preferred embodiment of the invention, disposed in front of the image transmitter is an inclined semireflecting mirror through which the re-enlarged image can be observed. The thus achieved bending of the optical axis between image transmitter and, for example, the aforementioned concave mirror enables the observer to go up even closer to the three-dimensional image so that he can observe this image even more closely and thus more accurately. Secondly, however, he also has the possibility of looking "behind" the front elements of the three-dimensional image by moving his viewing angle out of the optical axis.

In a further preferred embodiment of the invention, as has already been indicated, to change the spatial positioning between image transmitter and observer, use is made of an element with optically transparent wedges which between them define a space which is inclined with respect to the optical axis, whereby one part can be deflected vertically with respect to the optical axis and the other part is spatially fixed. By deflecting the movable optical part, the space is changed in its width with the result that the observer has the impression of an image which is moving in depth.

The last-mentioned arrangement is particularly suitable for such apparatuses according to the invention in which different optical paths are used for reducing and for re-enlarging. A particularly good effect is achieved if the image shown by the image transmitter passes via a first optical path, through a semireflecting mirror to reach a retroreflector (cat's eye) and from there via the semireflecting mirror into a second path preferably of identical design to the first path, whereby the element exhibiting wedges is disposed in the second path. The deflection of the beam from the first optical path through the retroreflector into the second optical path opens up the possibility of compensating for optical errors. If, for example, the optical elements of the first path have an astigmatic aberration, the resulting error is compensated for by the aforementioned arrangement.

A particularly simple construction can be achieved with this variant in that the two optical paths each exhibit two converging lenses.

Further advantages will become apparent from the description and the appended drawings.

The invention is shown in the drawings and is explained in greater detail in the following description.

Figure 1:
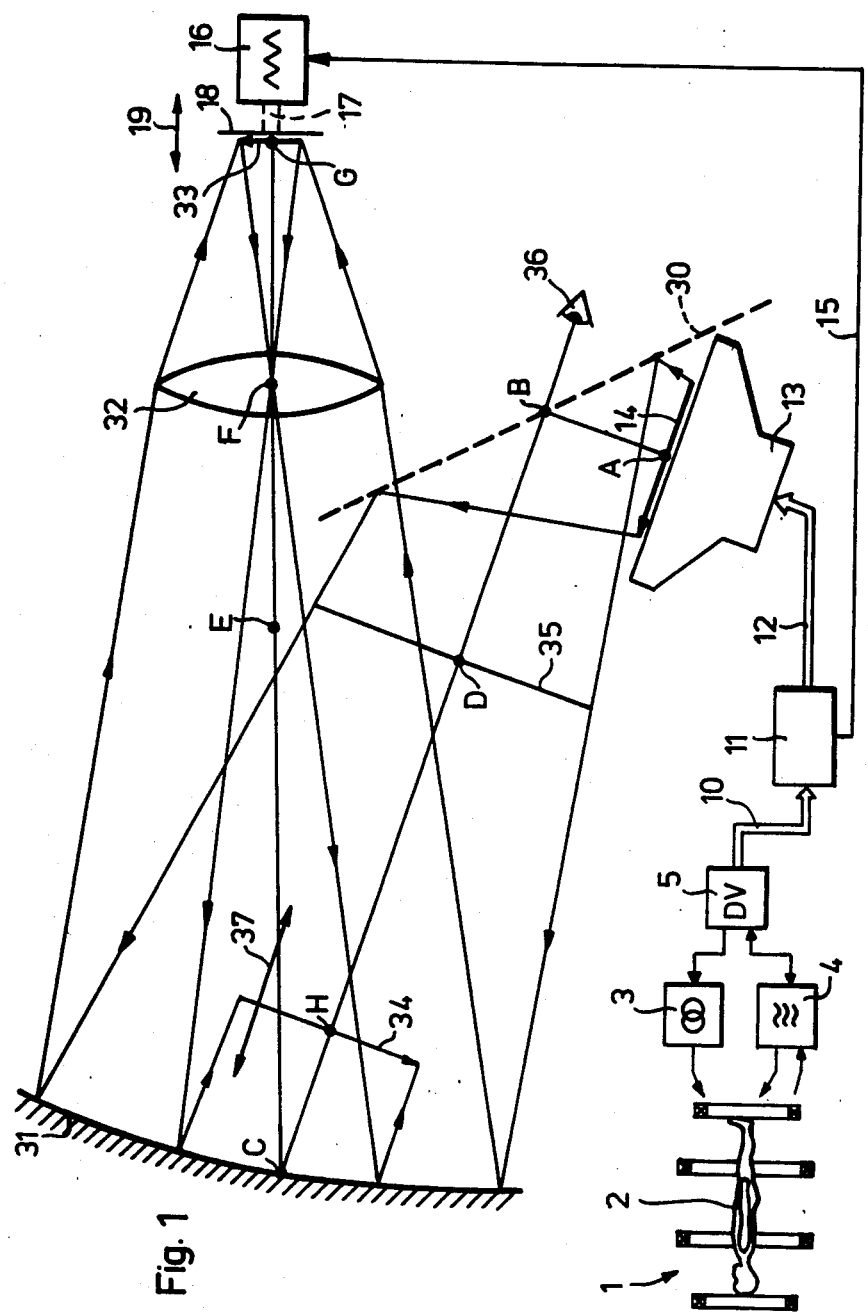
FIG. 1 shows a schematic representation of a nuclear-spin tomograph with (enlarged) a schematic drawing of a first embodiment of an apparatus according to the invention.

Shown schematically in the bottom left of FIG. 1 is a so-called nuclear-spin tomograph. A nuclear-spin tomograph comprises a magnet system 1, usually an arrangement consisting of several air-core coils. A patient 2 is disposed in the axis of the coils. The coils of the magnet system 1 as well as further, so-called gradient coils (not shown in FIG. 1) are fed by a power supply 3. In addition, the patient 2 is irradiated by a high-frequency field via coils which are fed by a high-frequency unit 4. The high-frequency unit 4 also receives the measured signals which correspond to the proton density in a cross-sectional plane of the patient 2 defined by the aforementioned variables. These measured signals are supplied to a data processing system 5 which, in turn, controls the power supply 3 and the high-frequency unit 4. From the received signals, the data processing system 5 computes a two-dimensional image which corresponds to the aforementioned proton density distribution in the selected cross-sectional plane of the patient 2. The data corresponding to these two-dimensional images are fed via a data line 10 to a further computer system 11. In this computer system 11 the two-dimensional images corresponding to successive plane sections are stored and are transmitted sequentially via a further data line 12 to an image transmitter, preferably a monitor 13. The image shown on the monitor 13 is indicated by 14 in FIG. 1. Furthermore, via a control line 15 the further data processing system 11 controls a mechanical oscillator 16 which, through the intermediary of a linkage 17, deflects a plane mirror 18 in a direction 19 perpendicular to the surface of the latter.

The image 14 produced by the monitor 13 is imaged via a semireflecting mirror 30 onto a spatially-fixed concave mirror 31 and from there via a biconvex lens 32 onto the plane mirror 18 on which an image 33 is formed. The incident light ray is reflected by the plane mirror 18 and, after passing through the biconvex lens 32 and being reflected by the concave mirror 31, produces a stereoscopic image 34. This image 34 can be observed by an observer 36 as if the image 14 were reflected by an imaginary mirror 35.

The optical path resulting in the specimen embodiment according to FIG. 1 is explained in the following with reference to letters A, B, C, D, E, F, G, H which lie at the points shown in FIG. 1 on the ray as it moves back and forth. Point A lying in the centre of the image 14 is reflected onto the semireflecting mirror 30 at point B and leads to point C on the spatially-fixed concave mirror 31. The distance CE corresponds to the focal length of the concave mirror 31. Conversely, the distance EF corresponds to the focal length of the biconvex lens 32. As can thus be seen from FIG. 1, the concave mirror 31 and the lens 32 are spaced apart by a distance CF which corresponds to the sum of the focal lengths CE and EF. Point G in the centre of the image 33 on the plane mirror 18 is slightly outside or inside the focal length of the converging lens 32. As can be shown, the "common focal point" E of the optical elements 31 and 32 has the effect that, when the plane mirror 18 is deflected in direction 19 with the ensuing deflection 37 of the image 34, there is a constancy of the linear magnification at point H.

If one designates the focal length CE of the concave mirror 31 as f1 and the focal length EF of the lens 32 as f2 there results a linear magnification between images 34 and 33 of (f1/f2). Conversely, the stroke of the plane mirror 18 in direction 19 is smaller by a factor of $2 \times (f1/f2)^2$ than the stroke of the image 34 in direction 37. The factor 2 before the parentheses comes from the imaging through a mirror, namely the plane mirror 18.

In simplified terms, one may also picture the optical arrangement from FIG. 1 as if there were an imaginary mirror 35 (which, of course, does not really exist) at point D which is just as far away from point C as point E. It is on this imaginary mirror 35 that the observer 36 sees the image 14 of the monitor 13. Consequently, the distance HD is just as great as the distance DBA.

For the observer 36 this results in an image 34 wandering back and forth in space in direction 37 in synchronization with the production of images 14 on the monitor 13, said images 14 being synchronized with the deflection of the plane mirror 18 in direction 19. The aforementioned ratio of the focal lengths of concave mirror 31 and lens 32 may, in a practical embodiment, be between 9 and 10 so that, in the case of an approximately 7 to 8-fold reduction on the plane mirror 18, the latter need only execute an approx. 2 mm stroke in direction 19 in order to produce a stroke of the image 34 in direction 37 of between 160 and 200 mm. The aforementioned stroke of 2 mm amplitude is, however, readily possible with a sequence frequency of about 25 Hz if the plane mirror 18 is approx. 30 mm in diameter in order to reflect the image 33 approx. 20 mm in size with mirror to spare at the edges, and if the image 34 is about 7 to 8 times larger than 33, dimensions which are sufficient, for example, for imaging tomographic head shots.

Through the intermediary of the linkage 17 the mechanical oscillator 16 moves the plane mirror 18 strictly linearly with respect to time, i.e. in accordance, for example, with a triangle function. This results in an image 34 which moves linearly over time in direction 37 with the linear magnification unchanged. For this reason, the images 14 can be imaged on the monitor 13 in a constant sequence without any further correction to the image path, and the observer 36 receives a complete, true, three-dimensional image.

As can further be seen from FIG. 1, it is also possible to omit the semireflecting mirror 30 if the observer 36 looks past the monitor 13 in the direction of the concave mirror 31. However, the addition of the semireflecting mirror 30 has the advantage that the observer 36 comes up closer to the image 34, thereby enabling a more accurate observation of this image 34. In addition, by moving out of the optical axis BDHC, the observer 36 is able to look "behind" the front elements.

Figure 2:
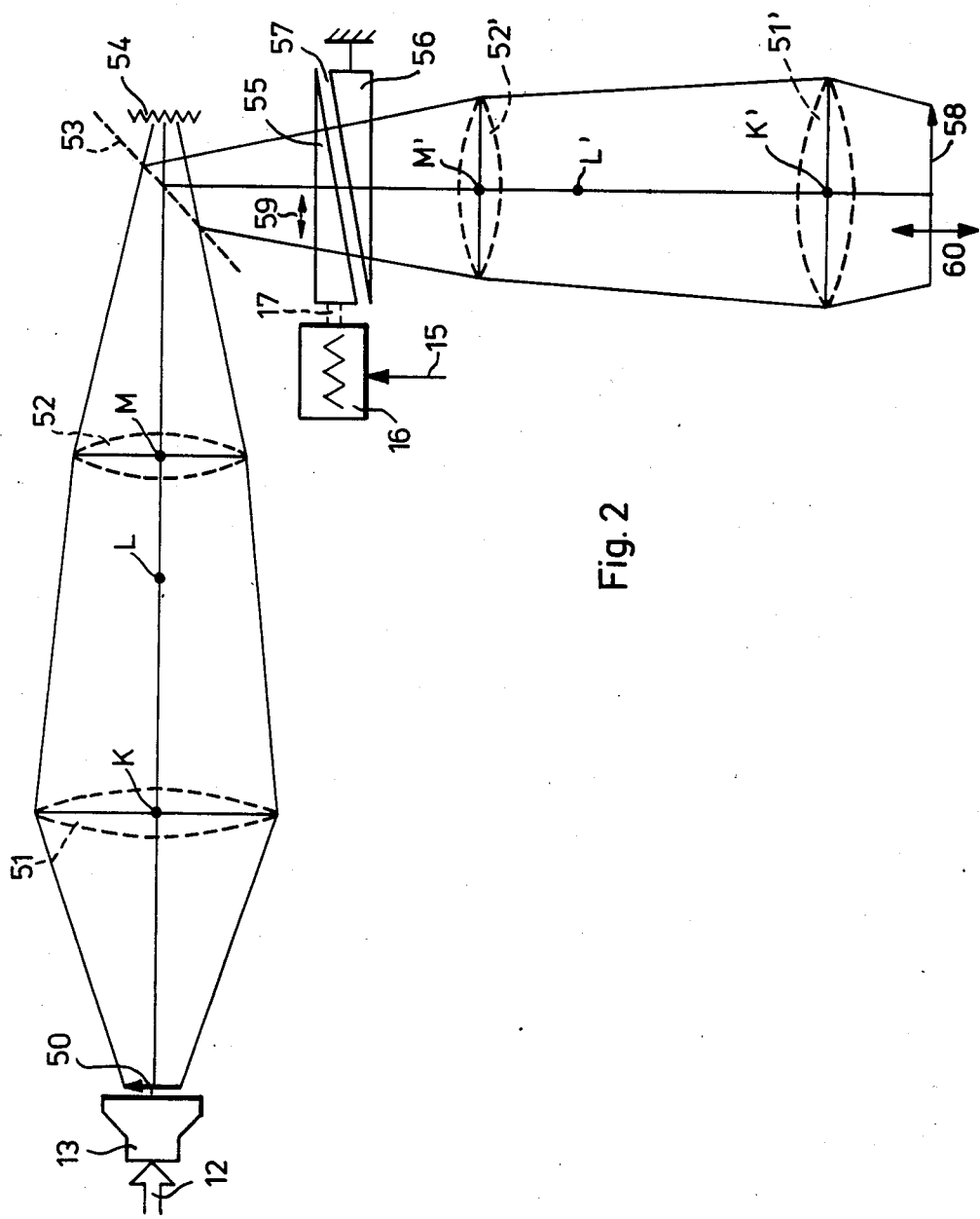
FIG. 2 shows a schematic drawing of a second embodiment of an apparatus according to the invention with separate paths for reduction and re-enlargement.

The second specimen embodiment of an apparatus according to the invention shown in FIG. 2 differs in two important respects from that shown in FIG. 1. Firstly, different paths are used for reducing the image and for re-enlarging it, and, secondly, the spatial shift of the image is achieved by other means.

At the left-hand edge of the arrangement shown in FIG. 2 one can once again see the monitor 13 which is fed by the data line 12 and which produces an image 50. This image 50 passes via a first converging lens 51 and a second converging lens 52 through a semireflecting mirror 53 onto a retroreflector 54 (also referred to as "cat's eye"). The rays reflected by the retroreflector 54 are reflected by the inclined semireflecting mirror 53 into a second optical path consisting of two converging lenses 52' and 51' whereby the second optical path is preferably of identical design to the first optical path.

In order, also in the specimen embodiment in FIG. 2, to obtain the advantages of the constant linear magnification, the lenses 51, 52 in the first optical path and 51', 52' in the second optical path are arranged so that they are spaced apart by a distance KM which corresponds to the sum of the focal lengths KL and LM. Point L is thus once again the "common" focal point of the lenses 51 and 52. The same applies to points K', L', M' of the second optical path.

To obtain the three-dimensional impression in an image 58 at the end of the second optical path, an element is disposed between the semireflecting mirror 53 and the lens 52' of the second optical path, said element consisting of two optically transparent wedges 55 and 56 disposed behind each other in the direction of the optical axis.

Between them, these wedges 55 and 56 define a space 57 which is inclined with respect to the optical axis. The wedge 55 is moved by the mechanical oscillator 16 in a direction 59 perpendicular to the optical axis so that the width of the space 57 changes at the rate at which the wedge 59 is deflected. Accordingly, the image 58 moves in a direction 60 lying in the optical axis, with the result that, once again, a three-dimensional impression is created for an observer sitting behind the second optical path.

With regard to the resulting sizes and linear magnification, the same applies as was stated already with respect to FIG. 1.

The arrangement shown in FIG. 2 is characterized by the fact that the retroreflector 54 reflects the rays which fall on it back in the same direction in which they came. If the elements disposed in the first optical path, namely the lenses 51 and 52, have optical errors, for example an astigmatism or a field curvature, the bundle of light having the aforementioned errors is passed through the semireflecting mirror 53 into the second optical path in which the aforementioned errors are compensated for since the second optical path which is of identical design to the first optical path also has the same errors, but, due to deflection through the retroreflector 54, in the opposite direction.

Thus, the arrangement according to FIG. 2 also exhibits those properties mentioned with respect to the specimen embodiment in FIG. 1—namely the spatially varying, strictly linear production of constantly equalsized two-dimensional images, this permitting the monitor images to be shown at a constant frame rate without any need for correction.

What is claimed is:

1. Apparatus for producing complete three-dimensional images of a spatial object comprising:
    image generator means for generating two-dimensional cross-sectional images corresponding to sections lying one behind the other in space within said object;
    image display means for displaying said images in sequence one after the other in time;
    optical viewing means for allowing said sequence of images to be viewed by an observer, said optical viewing means comprising a planar mirror and scale alteration means with at least two converging elements which are spaced apart by a distance corresponding to the sum of their focal length, said scale alteration means being arranged between said display means and said planar mirror for reducing said images in scale on an optical path from said display means to said mirror and for re-enlarging said images in scale on said optical path back from said mirror to said observer;
    actuating means coupled to said display means for altering the distance between said mirror and said scale alteration means in synchronism with said sequence of images.

2. Apparatus as defined in claim 1, wherein the scale alteration means exhibit lenses.

3. Apparatus as defined in claim 1, wherein the scale alteration means exhibit spherical or parabolic mirrors.

4. Apparatus as defined in claim 1, wherein the image (14) shown by the image generator is imaged on the planar mirror (18) through the intermediary of a concave mirror (31) and a biconvex lens (32).

5. Apparatus as defined in claim 4, wherein the distance of the planar mirror from the lens is slightly shorter or slightly longer than the focal length of the latter.

6. Apparatus as defined in claim 1, wherein two basically identical optical means are used for reducing and re-enlarging.

7. Apparatus as defined in claim 1, wherein the element is a plane mirror which is deflected perpendicularly to its surface.

8. Apparatus as defined in claim 7, wherein disposed in front of the image generator is an inclined semireflecting mirror through which the re-enlarged image can be observed.

9. Apparatus as defined in claim 7, wherein the planar mirror is deflected as a linear function of time.

* * * * *